(12) United States Patent
Tokunaga et al.

(10) Patent No.: US 8,508,269 B2
(45) Date of Patent: Aug. 13, 2013

(54) REFERENCE FREQUENCY GENERATION CIRCUIT, SEMICONDUCTOR INTEGRATED CIRCUIT, AND ELECTRONIC DEVICE

(71) Applicant: Panasonic Corporation, Osaka (JP)

(72) Inventors: Yusuke Tokunaga, Kyoto (JP); Shiro Sakiyama, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/724,803

(22) Filed: Dec. 21, 2012

(65) Prior Publication Data

US 2013/0154699 A1   Jun. 20, 2013

Related U.S. Application Data

(63) Continuation of application No. PCT/JP2011/001786, filed on Mar. 25, 2011.

(30) Foreign Application Priority Data

Jun. 28, 2010   (JP) .................................. 2010-146485

(51) Int. Cl.
*H03L 7/06* (2006.01)
(52) U.S. Cl.
USPC .......................................... 327/157; 327/148
(58) Field of Classification Search
USPC ................................................ 327/148, 157
See application file for complete search history.

(56) References Cited

U.S. PATENT DOCUMENTS

| 4,623,852 A | 11/1986 | Abou et al. | |
|---|---|---|---|
| 2009/0085677 A1* | 4/2009 | Lewis | 331/1 A |
| 2009/0262877 A1* | 10/2009 | Shi et al. | 375/376 |
| 2010/0237915 A1* | 9/2010 | Mobin et al. | 327/149 |
| 2011/0140754 A1 | 6/2011 | Tokunaga et al. | |
| 2011/0204940 A1* | 8/2011 | Kanda | 327/157 |
| 2012/0074998 A1* | 3/2012 | Brett et al. | 327/157 |
| 2013/0027097 A1* | 1/2013 | Wang et al. | 327/156 |

(Continued)

FOREIGN PATENT DOCUMENTS

| JP | 61-107810 A | 5/1986 |
|---|---|---|
| JP | 2002-135086 A | 5/2002 |
| WO | WO-2010/016167 A1 | 2/2010 |

OTHER PUBLICATIONS

International Search Report issued in International Patent Application No. PCT/JP2011/001786 dated Apr. 19, 2011.

(Continued)

*Primary Examiner* — Adam Houston
(74) *Attorney, Agent, or Firm* — McDermott Will & Emery LLP

(57) ABSTRACT

An oscillator circuit complementarily increases or reduces, in response to a transition of a signal level of a reference clock, a signal level of a first oscillation signal and a signal level of a second oscillation signal. An oscillation control circuit compares the first and second oscillation signals to a comparison voltage, and transitions the signal level of the reference clock in accordance with a result of the comparison. A reference control circuit increases or reduces the comparison voltage so that a difference between a signal level of an intermediate signal which is proportional to respective swings of the first and second oscillation signals and a reference voltage is reduced. A reference voltage control circuit increases or reduces the reference voltage according to a frequency difference between a basis clock and the reference clock.

16 Claims, 17 Drawing Sheets

(56) References Cited

U.S. PATENT DOCUMENTS

2013/0027098 A1* 1/2013 Wang et al. .................. 327/156
2013/0027099 A1* 1/2013 Wang et al. .................. 327/156
2013/0027100 A1* 1/2013 Yaghini et al. ............... 327/156

OTHER PUBLICATIONS

E.A.M. Klumperink et al., "Reducing MOSFET $1/f$ Noise and Power Consumption by Switched Biasing," IEEE Journal of Solid-State Circuits, vol. 35, No. 7, Jul. 2000.

* cited by examiner

REFERENCE FREQUENCY GENERATION CIRCUIT, SEMICONDUCTOR INTEGRATED CIRCUIT, AND ELECTRONIC DEVICE

CROSS-REFERENCE TO RELATED APPLICATIONS

This is a continuation of International Application No. PCT/JP2011/001786 filed on Mar. 25, 2011, which claims priority to Japanese Patent Application No. 2010-146485 filed on Jun. 28, 2010. The entire disclosures of these applications are incorporated by reference herein.

BACKGROUND

The present disclosure relates to a reference frequency generation circuit which generates a reference clock, and more particularly, relates to frequency correction of the reference clock.

Conventionally, a clock generation circuit such as a PLL and a DLL generates a clock having a desired frequency based on a reference frequency. International Patent Publication No. WO 2010/016167 describes a reference frequency generation circuit which is an example circuit for generating such a reference frequency. In the reference frequency generation circuit described in International Patent Publication No. WO 2010/016167, feedback control is performed so that swings of two oscillation signals generated by an oscillator circuit are constant, thereby reducing frequency fluctuations of the reference clock caused by fluctuations in delay time of an oscillation control circuit.

SUMMARY

However, a change in a time constant of an oscillator circuit causes frequency fluctuations of a reference clock. For example, in an oscillator circuit including a polysilicon resistor as a constituent element, application of heat or stress sometimes causes the resistance of the polysilicon resistor to change, resulting in a disadvantageous change in the time constant of the oscillator circuit. Specifically, when stress is applied to a polysilicon resistor, the polysilicon structure becomes distorted, and consequently, the resistance of the polysilicon resistor changes. When high heat (at about 200° C. or more) is applied to a polysilicon resistor, hydrogen ions are bonded to the dangling bond defects in the polysilicon resistor, and consequently, the resistance of the polysilicon resistor changes. Therefore, application of stress and heat in semiconductor chip fabrication processes (for example, application of stress in a package encapsulation step, and application of heat in a package surface printing step or a reflowing step) adversely causes frequency fluctuations of a reference clock.

It is therefore an object of the present disclosure to provide a reference frequency generation circuit capable of correcting frequency fluctuations of a reference clock.

According to one aspect of the present disclosure, a reference frequency generation circuit which generates a reference clock includes: an oscillator circuit configured to alternately perform, in response to a transition of a signal level of the reference clock, an operation to increase a signal level of a first oscillation signal and reduce a signal level of a second oscillation signal, and an operation to increase the signal level of the second oscillation signal and reduce the signal level of the first oscillation signal; an oscillation control circuit configured to cause, when detecting that the signal level of the first oscillation signal has reached a comparison voltage, the signal level of the reference clock to transition to a first logic level, and cause, when detecting that the signal level of the second oscillation signal has reached the comparison voltage, the signal level of the reference clock to transition to a second logic level; a reference control circuit configured to increase or reduce the comparison voltage so that a difference between a signal level of an intermediate signal which is proportional to respective swings of the first and second oscillation signals and a reference voltage is reduced; and a reference voltage control circuit configured to increase or reduce the reference voltage according to a frequency difference between a basis clock having a predetermined basis frequency and the reference clock.

The reference frequency generation circuit can correct frequency fluctuations of the reference clock based on the basis clock serving as a reference by increasing or reducing the reference voltage according to the frequency difference between the basis clock and the reference clock.

The reference voltage control circuit may be switchable between a frequency correction mode and a constant frequency mode. In the frequency correction mode, the reference voltage control circuit increases or reduces the reference voltage according to the frequency difference between the basis clock and the reference clock. In the constant frequency mode, the reference voltage control circuit maintains the reference voltage regardless of the frequency difference between the basis clock and the reference clock. With the reference voltage control circuit configured in this manner, the power consumption of the reference frequency generation circuit can be reduced, compared to when the reference voltage control circuit constantly performs the frequency correction operation.

DETAILED DESCRIPTION

Figure 1:
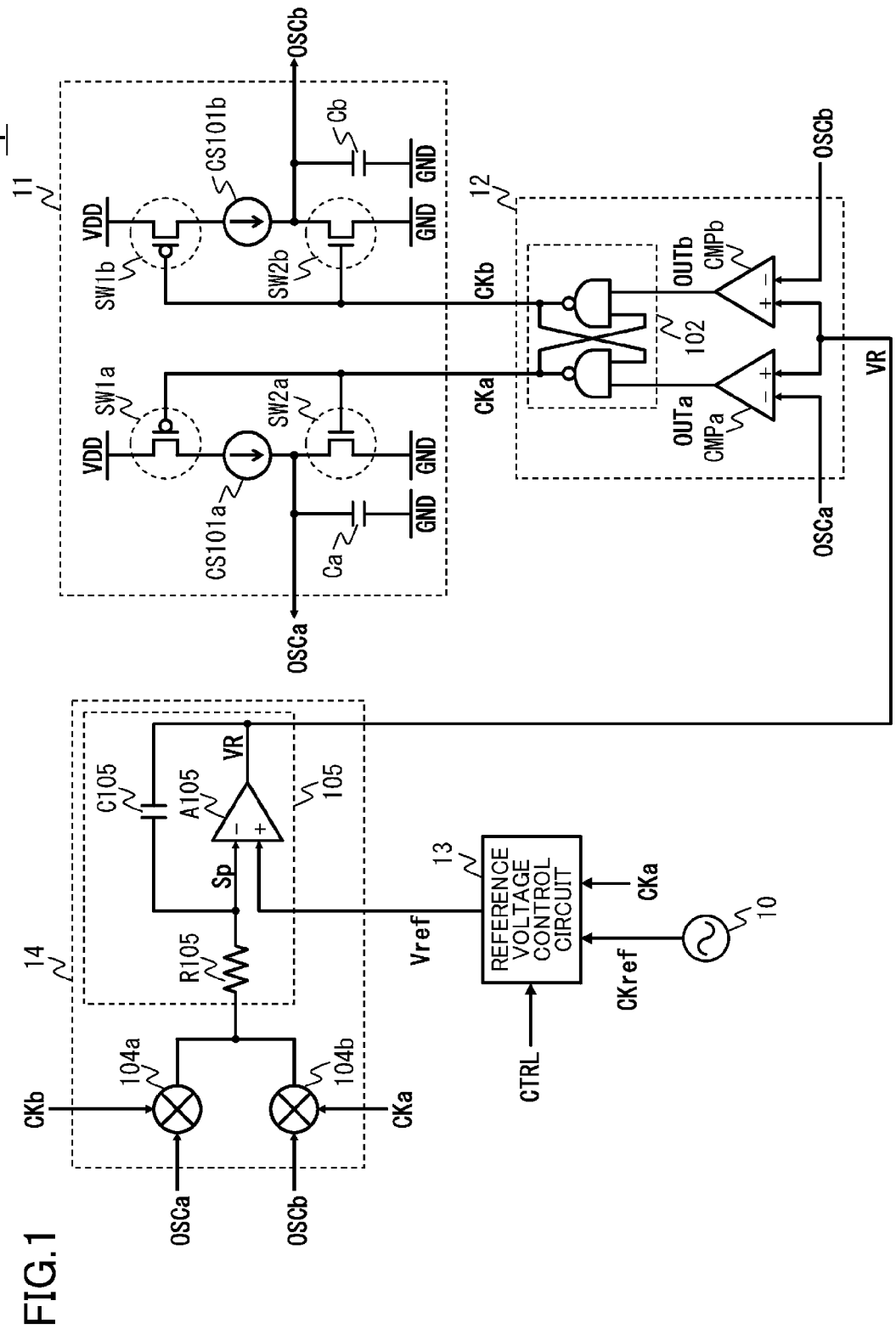
FIG. 1 is a diagram illustrating a configuration example of a reference frequency generation circuit.

Embodiments of the present disclosure will be described below in detail with reference to the attached drawings. Note that like reference characters denote the same or equivalent components in the drawings, and the explanation thereof is not repeated.

[Reference Frequency Generation Circuit]

FIG. 1 shows an example configuration of a reference frequency generation circuit 1. The circuit 1 is configured to generate reference clocks CKa and CKb, and includes an oscillator circuit 11, an oscillation control circuit 12, a reference voltage control circuit 13, and a reference control circuit 14. Each of the reference clocks CKa and CKb has a frequency corresponding to a time constant of the oscillator circuit 11, and the signal levels of the reference clocks CKa and CKb change in a complementary manner.

[Oscillator Circuit and Oscillation Control Circuit]

The oscillator circuit 11 increases or reduces the signal levels of oscillation signals OSCa and OSCb in a complementary manner in response to transitions of the signal levels of the reference clocks CKa and CKb. The oscillator circuit 11 includes capacitors Ca and Cb configured to respectively generate the oscillation signals OSCa and OSCb, constant current sources CS101a and CS101b configured to supply constant currents, and switches SW1a, SW2a, SW1b, and SW2b (connection switching section) configured to switch connection states of the capacitors Ca and Cb. When detecting that the signal level of the oscillation signal OSCa (or the signal level of the oscillation signal OSCb) has exceeded a comparison voltage VR, the oscillation control circuit 12 causes the signal levels of the reference clocks CKa and CKb to transition. The oscillation control circuit 12 includes a comparator CMPa configured to compare the comparison voltage VR to the signal level of the oscillation signal OSCa, a comparator CMPb configured to compare the comparison voltage VR to the signal level of the oscillation signal OSCb, and an RS latch circuit 102 configured to receive output signals OUTa and OUTb of the comparators CMPa and CMPb and to output the reference clocks CKa and CKb.

[Oscillation Operation]

Figure 2:
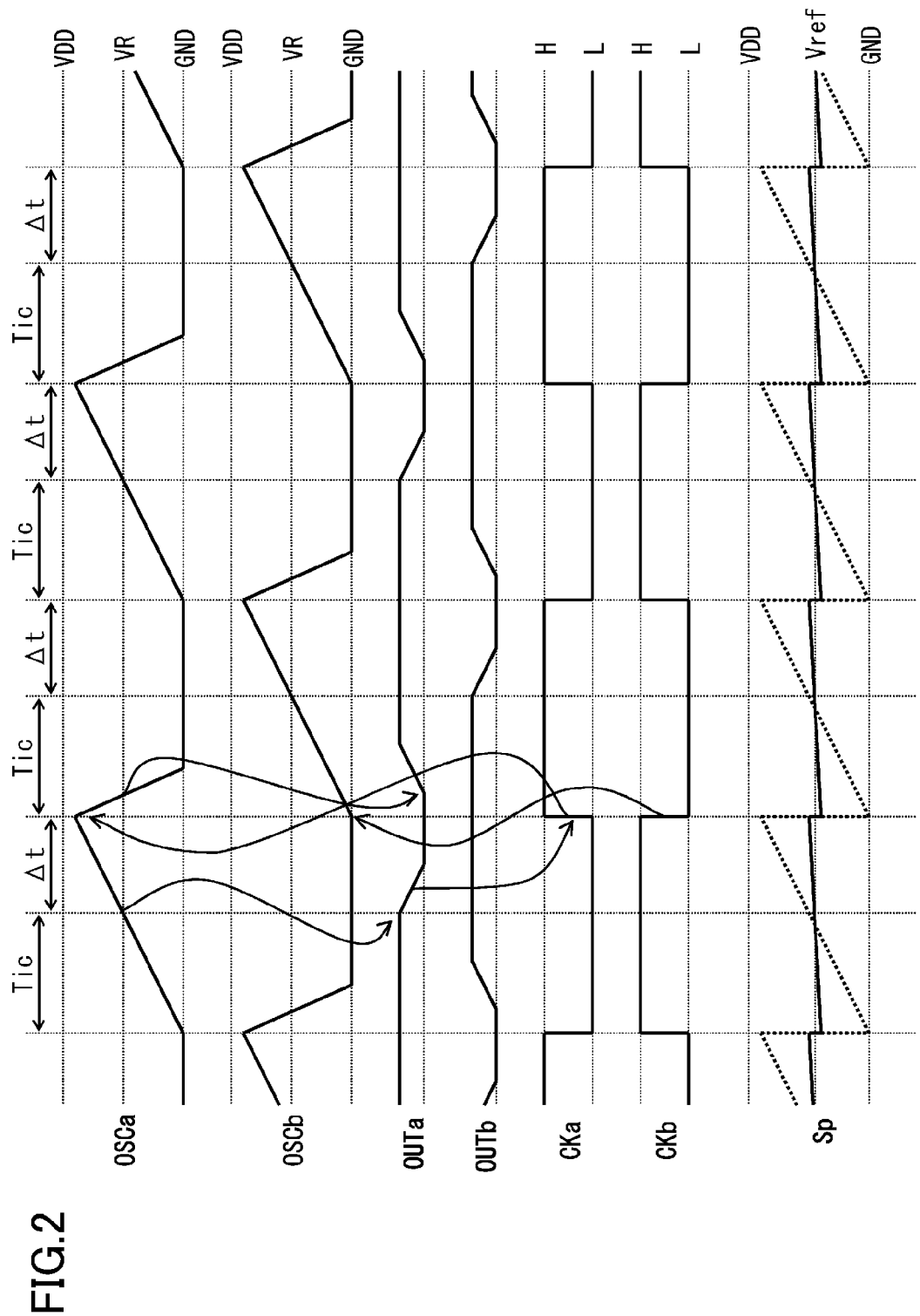
FIG. 2 is a timing chart illustrating oscillation operation by the reference frequency generation circuit illustrated in FIG. 1.

Here, an oscillation operation by the oscillator circuit 11 and the oscillation control circuit 12 of FIG. 1 will be described with reference to FIG. 2.

When the signal level of the oscillation signal OSCa has exceeded the comparison voltage VR, the comparator CMPa causes the output signal OUTa to transition from the high level to the low level. In response to the transition of the output signal OUTa, the RS latch circuit 102 causes the reference clock CKa to transition to the high level and causes the reference clock CKb to transition to the low level. In the oscillator circuit 11, in response to the transitions of the reference clocks CKa and CKb, the switches SW1a and SW2b are turned off, and the switches SW1b and SW2a are turned on, so that the capacitor Ca is discharged and the capacitor Cb is charged. Thus, the oscillator circuit 11 reduces the signal level of the oscillation signal OSCa, and increases the signal level of the oscillation signal OSCb with an IC time constant (a time constant determined based on the current value of the constant current source CS101b and the capacitance value of the capacitor Cb).

When the signal level of the oscillation signal OSCb has exceeded the comparison voltage VR, the comparator CMPb causes the output signal OUTb to transition from the high level to the low level, and the RS latch circuit 102 causes the reference clocks CKa and CKb to transition respectively to the low level and the high level. In the oscillator circuit 11, in response to the transitions of the reference clocks CKa and CKb, the switches SW1a and SW2b are turned on, and the switches SW1b and SW2a are turned off, so that the capacitor Ca is charged and the capacitor Cb is discharged. Thus, the oscillator circuit 11 increases the signal level of the oscillation signal OSCa with an IC time constant (a time constant determined based on the current value of the constant current source CS101a and the capacitance value of the capacitor Ca), and reduces the signal level of the oscillation signal OSCb.

[Reference Control Circuit]

The reference control circuit 14 increases or reduces the comparison voltage VR so that a difference between the signal level of an intermediate signal Sp which is proportional to respective swings of the oscillation signals OSCa and OSCb (i.e., the cumulative averaged voltage for the time constant waveforms of the oscillation signals OSCa and OSCb in this case) and the reference voltage Vref is reduced. The reference control circuit 14 includes switches 104a and 104b (switching circuit), and an RC filter 105.

When the signal level of the reference clock CKb is at the high level, the switch 104a is turned on to cause the oscillation signal OSCa to pass therethrough. On the other hand, the signal level of the reference clock CKa is at the low level, and thus, the switch 104b is turned off to cut off the oscillation signal OSCb. When the signal level of the reference clock CKb is at the low level, the switch 104a is turned off to cut off the oscillation signal OSCa. On the other hand, the signal level of the reference clock CKa is at the high level, and thus, the switch 104b is turned on to cause the oscillation signal OSCb to pass therethrough. In this manner, in response to the transitions of the signal levels of the reference clocks CKa and CKb, the oscillation signals OSCa and OSCb are caused to alternately pass, thereby supplying time constant waveform components (i.e., waveform components which increase with the time constant of the oscillator circuit 11) of the reference clocks CKa and CKb to the RC filter 105.

The RC filter 105 has a function of extracting, from the oscillation signals OSCa and OSCb which have passed through the switches 104a and 104b, the intermediate signal Sp which is proportional to the swings of the oscillation signals (a signal-extracting function), and a function of outputting the comparison voltage VR corresponding to a difference between the signal level of the intermediate signal Sp and the reference voltage Vref (a difference-outputting function). For example, the RC filter 105 includes a resistor R105, a capacitor C105, and a differential amplifier circuit A105. That is, the RC filter 105 is configured by an integration circuit having both of the signal-extracting function and the difference-outputting function.

[Feedback Control]

Figure 3:
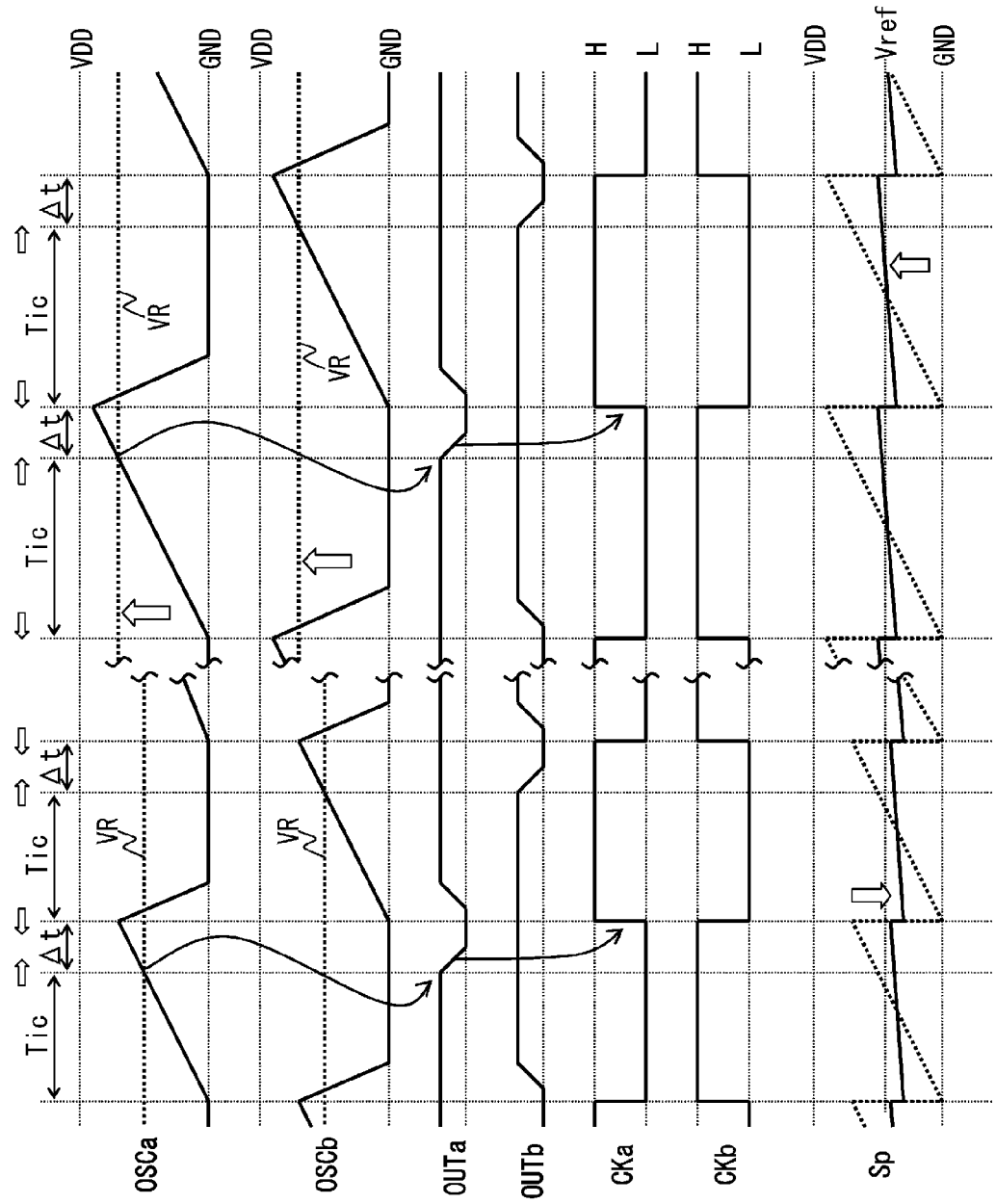
FIG. 3 is a timing chart illustrating a feedback control by the reference frequency generation circuit illustrated in FIG. 1.

Next, feedback control by the reference control circuit 14 shown in FIG. 1 will be described with reference to FIG. 3.

When a response time Δt of the oscillation control circuit 12 (a delay time from when the signal level of the oscillation signal OSCa or OSCb reaches the comparison voltage VR to when the signal level of the reference clock CKa or CKb transitions) is reduced, a cycle of the reference clock CKa or CKb is reduced. Also, an increasing period of the signal level of the oscillation signal OSCa or OSCb (i.e., a charging period of the capacitor Ca or Cb) is reduced, and thus, the maximum swing of the oscillation signal OSCa or OSCb is reduced. Consequently, the signal level of the intermediate signal Sp falls below the reference voltage Vref, and therefore, the reference control circuit 14 increases the comparison voltage VR. Thus, a transient time Tic (a time from when the signal level of the reference clock CKa or CKb transitions to when the signal level of the oscillation signal OSCa or OSCb reaches the comparison voltage VR) is increased, so that the cycle of the reference clock CKa or CKb is increased. Also, the increasing period of the signal level of the oscillation signal OSCa or OSCb is increased, the maximum swing of the oscillation signal OSCa or OSCb is increased, and the difference between the signal level of the intermediate signal Sp and the reference voltage Vref is reduced.

Conversely, when the response time Δt of the oscillation control circuit 12 is increased, the cycle of the reference clock CKa or CKb is increased. Also, the increasing period of the signal level of the oscillation signal OSCa or OSCb is increased, and consequently, the signal level of the intermediate signal Sp exceeds the reference voltage Vref. Therefore, the reference control circuit 14 reduces the comparison voltage VR. Thus, the transient time Tic is reduced, so that the cycle of the reference clock CKa or CKb is reduced.

In the above-described manner, frequency fluctuations of the reference clocks CKa and CKb caused by fluctuations in delay time can be reduced by performing the feedback control so that respective swings of the oscillation signals OSCa and OSCb are constant. Thus, the frequency of each of the reference clocks CKa and CKb can be increased while increase in power consumptions (in particular, the power consumptions of the comparators CMPa and CMPb) can be reduced.

Furthermore, since noise components in bands lower than the loop band for the feedback control are attenuated, low frequency noise in the reference frequency generation circuit (e.g., low frequency noise of the comparison voltage VR, output noise of the comparators CMPa and CMPb) can be reduced. Thus, the resonance characteristic (Q factor) of the reference frequency generation circuit can be improved, and variations in the frequencies of the reference clocks CKa and CKb can be reduced.

[Reference Voltage Control Circuit]

The reference voltage control circuit 13 has operation modes, i.e., a frequency correction mode and a constant frequency mode. Switching between the operation modes of the reference voltage control circuit 13 is carried out based on an external control signal CTRL. The reference voltage control circuit 13 is supplied with a basis clock CKref (a clock having a predetermined frequency) generated by an oscillator 10 (for example, a quartz oscillator) and any one of the reference clock CKa or the reference clock CKb (in this embodiment, the reference clock CKa) generated by the oscillation control circuit 12. Note that the reference voltage control circuit 13 may receive the reference clock CKa through a frequency divider circuit (not shown).

In the frequency correction mode, the reference voltage control circuit 13 increases or reduces the reference voltage Vref according to a frequency difference between the basis clock CKref and the reference clock CKa. For example, when the frequency of the reference clock CKa is higher than that of the basis clock CKref, the circuit 13 increases the reference voltage Vref according to the frequency difference between the basis clock CKref and the reference clock CKa, resulting in that the comparison voltage VR increases in the reference control circuit 14 and the frequency of the reference clock CKa decreases in the oscillation control circuit 12. In this manner, the reference voltage Vref is controlled so that the frequency of the reference clock CKa approximates that of the basis clock CKref. In the constant frequency mode, the reference voltage control circuit 13 maintains the reference voltage Vref regardless of the frequency difference between the basis clock CKref and the reference clock CKa. That is, in the constant frequency mode, the reference voltage control circuit 13 does not preform the above operation to correct the frequency.

In the above-described manner, frequency fluctuations of the reference clocks CKa and CKb can be corrected based on the basis clock CKref serving as a reference by increasing or reducing the reference voltage Vref according to the frequency difference between the basis clock CKref and the reference clock CKa.

Setting the reference voltage control circuit 13 in the constant frequency mode can reduce power consumption of the reference frequency generation circuit 1, compared to setting the circuit 13 in the frequency correction mode. Thus, the power consumption of the reference frequency generation circuit 1 can be reduced by switching the operation modes of the reference voltage control circuit 13, compared to when the circuit 13 constantly performs the frequency correction operation.

[Frequency Correction Period]

A period during which the reference voltage control circuit 13 is in the frequency correction mode (a frequency correction period) may set in a period during which the reference clocks CKa and CKb are not used (a period during which supply of the reference clocks CKa and CKb may be stopped).

For example, the frequency correction period may be set in an inspection period during which the reference frequency generation circuit 1 (or a semiconductor integrated circuit including the reference frequency generation circuit 1) is subjected to an inspection before shipment from a factory. In this manner, frequency fluctuations of the reference clocks CKa and CKb caused by stress or heat created in semiconductor chip fabrication processes can be corrected.

The frequency correction period may also be set in a period (e.g., an initialization period after power-on, or a reset period) during which an electronic device including the reference frequency generation circuit 1 is not in operation. In this manner, frequency fluctuations of the reference clocks CKa and CKb caused by deterioration over time can be corrected. For example, if a receiver (e.g., a radio or a television set) includes the reference frequency generation circuit 1, the frequency correction period may be set after selection of a channel by the receiver. If an audio playback device includes the reference frequency generation circuit 1, the frequency correction period may be set after selection of a musical piece or immediately before playing back of the musical piece by the audio playback device. If an image playback device includes the reference frequency generation circuit 1, the frequency correction period may be set after selection of a moving image or immediately before playing back of the moving image by the image reproduction device.

Configuration Example 1 of Reference Voltage Control Circuit

Figure 4:
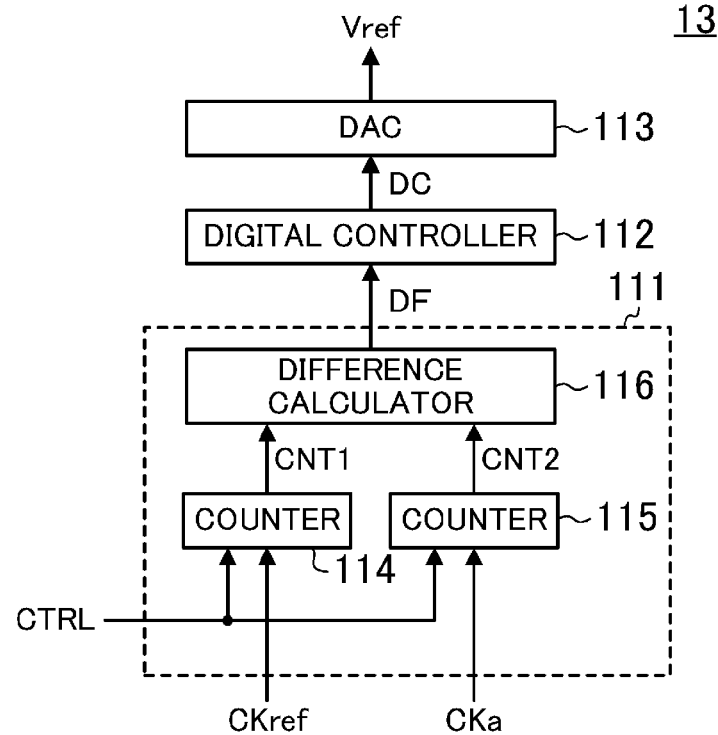
FIG. 4 is a diagram illustrating configuration example 1 of a reference voltage control circuit.

As shown in FIG. 4, the reference voltage control circuit 13 may include a frequency comparator 111, a digital controller 112, and a digital-to-analog converter (DAC) 113. The frequency comparator 111 may include counters 114 and 115, and a difference calculator 116. The counters 114 and 115 have operation modes, i.e. a frequency correction mode and a constant frequency mode. The switching between the operation modes of each of the counters 114 and 115 is carried out based on a control signal CTRL. In the frequency correction mode, the counters 114 and 115 respectively count the number of transitions (e.g. the number of rising-edges) of the basis clock CKref and the number of transitions of the reference clock CKa occurring in a predetermined period. The counters 114 and 115 may repeat the counting operation in a period during which the counters 114 and 115 are set in the frequency correction mode. In the constant frequency mode, the counters 114 and 115 respectively maintain a count value CNT1 (the number of transitions of the basis clock CKref) and a count value CNT2 (the number of transitions of the reference clock CKa). The difference calculator 116 outputs a difference between the count values CNT1 and CNT2 (e.g. a value given by subtracting the count value CNT1 from the count value CNT2) as a frequency difference value DF. The digital controller 112 increases or reduces a control value DC (i.e. a digital value corresponding to the voltage level of the reference voltage Vref) according to the frequency difference value DF. The DAC 113 converts the control value DC into the reference voltage Vref.

For example, in the frequency correction mode, the frequency comparator 111 increases the frequency difference value DF with increasing excess of the frequency of the reference clock CKa over the frequency of the basis clock CKref The digital controller 112 increases the control value DC as the frequency difference value DF increases. The DAC 113 increases the reference voltage Vref as the frequency difference value DF increases. On the other hand, in the constant frequency mode, since the frequency difference value DF remains unchanged, the digital controller 112 maintains the control value DC, resulting in that the DAC 113 maintains the reference voltage Vref.

In the above-described manner, in the constant frequency mode, since the control value DC determining the voltage level of the reference voltage Vref is continuously supplied to the DAC 113, the reference voltage Vref can be maintained in the constant frequency mode. In addition, since the frequency comparator 111 and the digital controller 112 can be configured by digital circuits, the area of the circuit can be reduced compared to when a phase frequency comparator is configured by an analog circuit is used.

Configuration Example of Digital-to-Analog Converter

Figure 5:
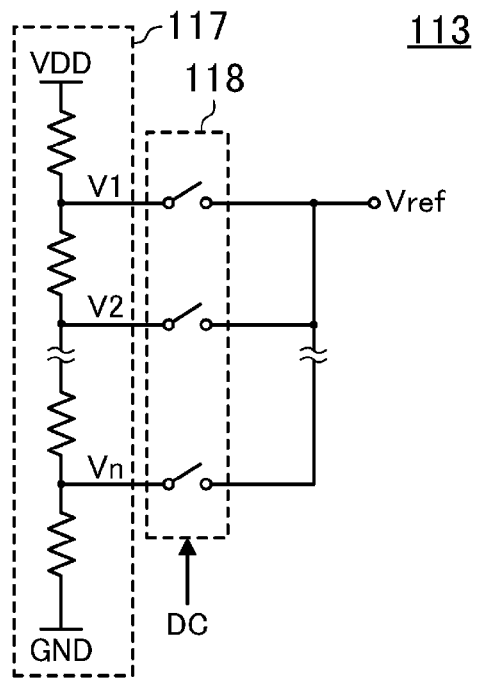
FIG. 5 is a diagram illustrating a configuration example of a digital-to-analog converter.

As shown FIG. 5, the DAC 113 may include a resistance divider 117 and a selector 118. The resistance divider 117 is configured by a plurality of resistor elements which are connected in series between a power supply node provided with a power supply voltage VDD and a ground node provided with a ground voltage GND. The resistance divider 117 generates n (where n is an integer equal to or more than 2) different analog voltages V1, V2, . . . , and Vn by resistance division between the power supply voltage VDD and the ground voltage GND. The selector 118 selects one of the n analog voltages V1, V2, . . . , and Vn as the reference voltage Vref according to the control value DC provided to the DAC 113. Since the resistor elements (in particular, when the resistance elements are polysilicon resistors) constituting the resistance divider 117 have a significantly small relative error, the analog voltages V1, V2, . . . , and Vn can be generated accurately (for example, with an error of about 0.1%). Accordingly, the reference voltage Vref corresponding to the control value DC can be generated accurately. In addition, since stress and heat created in semiconductor chip fabrication processes (such as a package encapsulation step, a package surface printing step, and a reflowing step) are uniformly applied to the resistor elements constituting the resistance divider 117, the relative error caused by the stress and the heat are negligible. Note that the DAC 113 may have a different configuration.

Configuration Example 2 of Reference Voltage Control Circuit

Figure 6:
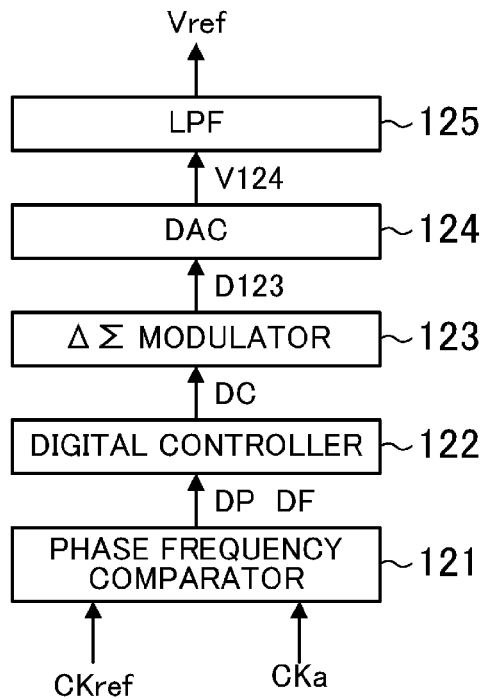
FIG. 6 is a diagram illustrating configuration example 2 of the reference voltage control circuit.

The reference frequency generation circuit 1 may include, instead of the reference voltage control circuit 13, a reference voltage control circuit 23 shown in FIG. 6. The reference voltage control circuit 23 includes a phase frequency comparator 121, a digital controller 122, a $\Delta\Sigma$ modulator 123, a digital-to-analog converter (DAC) 124, and a low-pass filter (LPF) 125. The phase frequency comparator 121 detects a phase difference and a frequency difference between the basis clock CKref and the reference clock CKa, and outputs a phase difference value DP and a frequency difference value DF respectively corresponding the phase difference and the frequency difference. For example, the phase frequency comparator 121 has a configuration similar to that of a phase frequency comparator used in a general digital PLL. The digital controller 122 increases or reduces a control value DC (i.e. a digital value corresponding to the voltage level of the reference voltage Vref) according to the phase difference value DP and the frequency difference value DF. The $\Delta\Sigma$ modulator 123 performs $\Delta\Sigma$ modulation on the control value DC to generate a control value D123. This $\Delta\Sigma$ modulation can bias quantization noise included in the control value DC to a high-frequency region. The DAC 124 converts the control value D123 into a reference voltage V124. The DAC 124 may have a configuration similar to that of the DAC 113 shown in FIG. 5 or a different configuration. The LPF 125 attenuates the high-frequency components of the reference voltage V124 to generate the reference voltage Vref.

For example, the phase frequency comparator 121 increases the frequency difference value DF with increasing excess of the frequency of the reference clock CKa over the frequency of the basis clock CKref. The digital controller 122 increases the control value DC as the frequency difference value DF increases. The DAC 124 increases the reference voltage Vref as the control value DC increases.

In the reference voltage control circuit 23 shown in FIG. 6, since the phase frequency comparator 121, the digital controller 122, and the $\Delta\Sigma$ modulator 123 can be configured by digital circuits, the area of the circuits can be reduced compared to when a phase frequency comparator configured by an analog circuit is used. In addition, use of the $\Delta\Sigma$ modulator 123 enables controlling the reference voltage Vref with accuracy higher than that of the resolution of the DAC 124.

As described in U.S. Pat. No. 6,326,851, the phase frequency comparator 121 may include a time-to-digital converter (TDC). The basis clock CKref or the reference clock CKa may be used as an operation clock of the ΔΣ modulator 123. For example, when the ΔΣ modulator 123 uses, as the operation clock, the basis clock CKref or the reference clock CKa, whichever is higher in frequency, a time constant of the LPF 125 can be reduced (i.e. the circuit area of the LPF 125 can be reduced), compared to when the ΔΣ modulator 123 uses, as the operation clock, the other clock which is lower in frequency.

Configuration Example 3 of Reference Voltage Control Circuit

Figure 7:
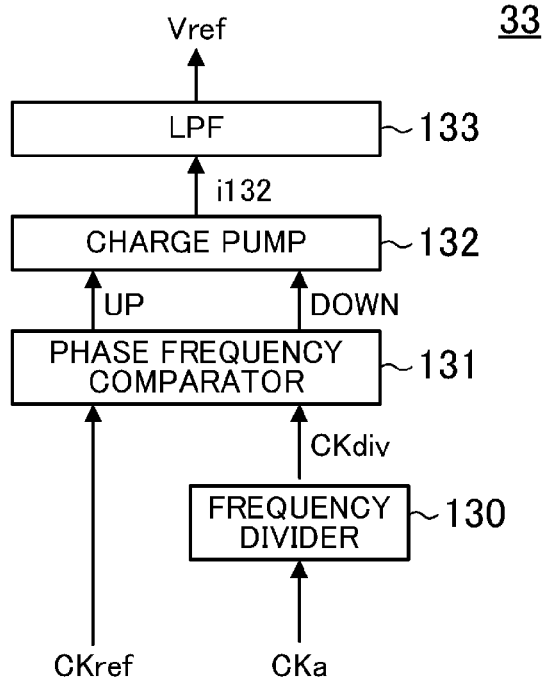
FIG. 7 is a diagram illustrating configuration example 3 of the reference voltage control circuit.

The reference frequency generation circuit 1 may include, instead of the reference voltage control circuit 13, a reference voltage control circuit 33 shown in FIG. 7. The reference voltage control circuit 33 includes a frequency divider 130, a phase frequency comparator 131, a charge pump 132, and a low-pass filter (LPF) 133. The frequency divider 130 divides the frequency of the reference clock CKa and outputs the resultant clock as a divided clock CKdiv. The phase frequency comparator 131 detects a phase difference and a frequency difference between the basis clock CKref and the divided clock CKdiv, and outputs a charge signal UP or a discharge signal DOWN according to the phase difference and the frequency difference. For example, the phase frequency comparator 131 has a configuration similar to that of a phase frequency comparator used in a general analog PLL. The charge pump 132 outputs, as an output current i132, any one of a charge current (a current for increasing a reference voltage Vref) or a discharge current (a current for reducing the reference voltage Vref) in response to the charge signal UP or the discharge signal DOWN. The LPF 133 converts the output current i132 from the charge pump 132 into the reference voltage Vref.

For example, the phase frequency comparator 131 extends a time during which the charge signal UP is output with increasing excess of the frequency of the divided clock CKdiv over the frequency of the basis clock CKref. The charge pump 132 extends a period (a charge period) during which the charge current is output as the output current i132, as the time during which the charge signal UP is output is extended. The reference voltage Vref generated by the LPF 133 increases as the charge period is extended. The phase frequency comparator 131 extends a time during which the discharge signal DOWN is output, as the frequency of the divided clock CKdiv decreases from the frequency of the basis clock CKref. The charge pump 132 extends a period (a discharge period) during which the discharge current is output as the output current i132, as the time during which the discharge signal DOWN is output is extended. The reference voltage Vref generated by the LPF 133 decreases as the discharge period is extended.

Configuration Example 4 of Reference Voltage Control Circuit

Figure 8:
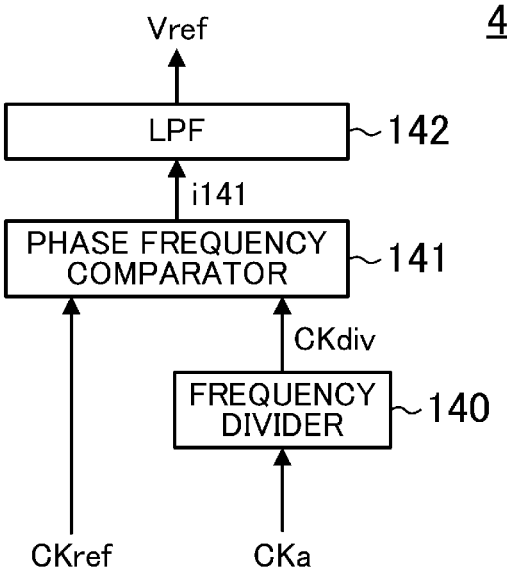
FIG. 8 is a diagram illustrating configuration example 4 of the reference voltage control circuit.

The reference frequency generation circuit 1 may include, instead of the reference voltage control circuit 13, a reference voltage control circuit 43 shown in FIG. 8. The reference voltage control circuit 43 includes a frequency divider 140, a phase frequency comparator 141, and a low-pass filter (LPF) 142. The frequency divider 140 divides the frequency of the reference clock CKa and outputs the resultant clock as a divided clock CKdiv. The phase frequency comparator 141 detects a phase difference and a frequency difference between the basis clock CKref and the divided clock CKdiv, and outputs an output current i141 according to the phase difference and the frequency difference. The LPF 142 converts the output current i141 into the reference voltage Vref.

For example, the phase frequency comparator 141 extends a time (a charge time) during which the output current i141 is output with increasing excess of the frequency of the divided clock CKdiv over the frequency of the basis clock CKref. The reference voltage Vref generated by the LPF 142 increases as the charge time is extended.

[Radio Path]

Figure 9:
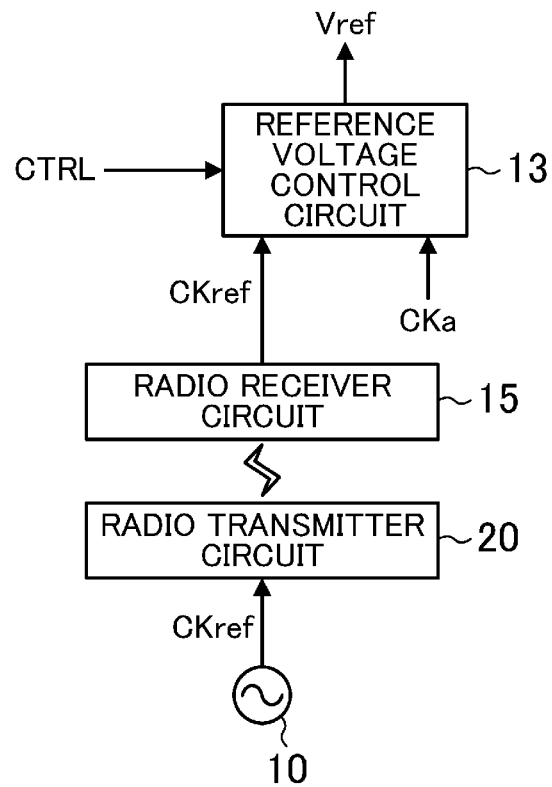
FIG. 9 is a diagram illustrating a radio receiver circuit.

The reference frequency generation circuit 1 may further include a radio receiver circuit 15 shown in FIG. 9. In such a case, the basis clock CKref generated by the oscillator 10 is transmitted as a radio signal by a radio transmitter circuit 20. The radio receiver circuit 15 receives the basis clock CKref transmitted as the radio signal by the radio transmitter circuit 20, and supplies the basis clock CKref to the reference voltage control circuit 13. In this manner, the basis clock CKref may be supplied to the reference voltage control circuit 13 through a radio path. Thus, the reference frequency generation circuit 1 is applicable to a radio receiver to which the basis clock CKref is transmitted through a radio path. For example, the reference frequency generation circuit 1 is applicable to a super low power consumption type radio network for use in a smart grid.

[Variation of Oscillator Circuit]

Figure 10:
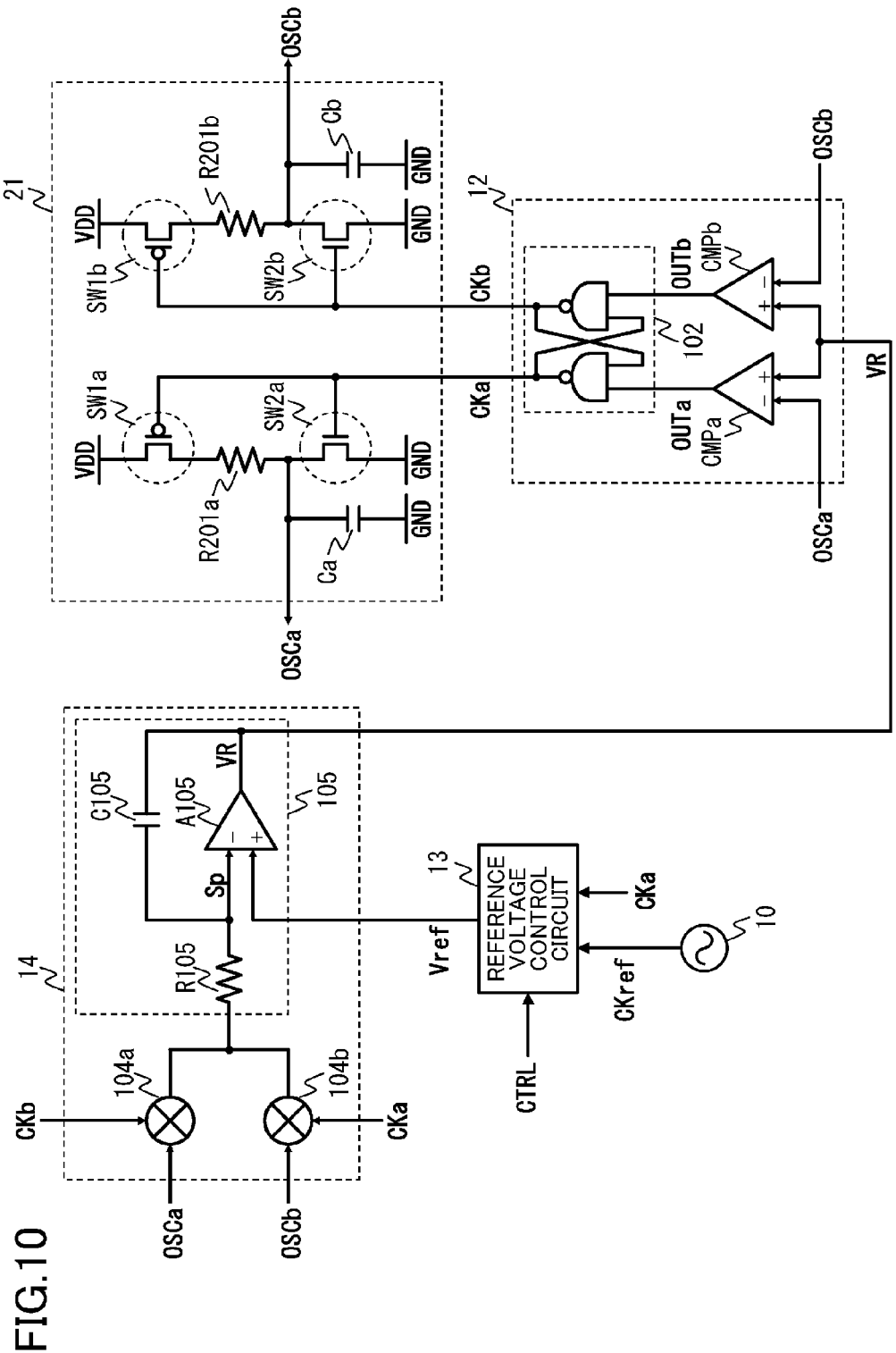
FIG. 10 is a diagram illustrating a variation of an oscillator circuit.
Figure 11:
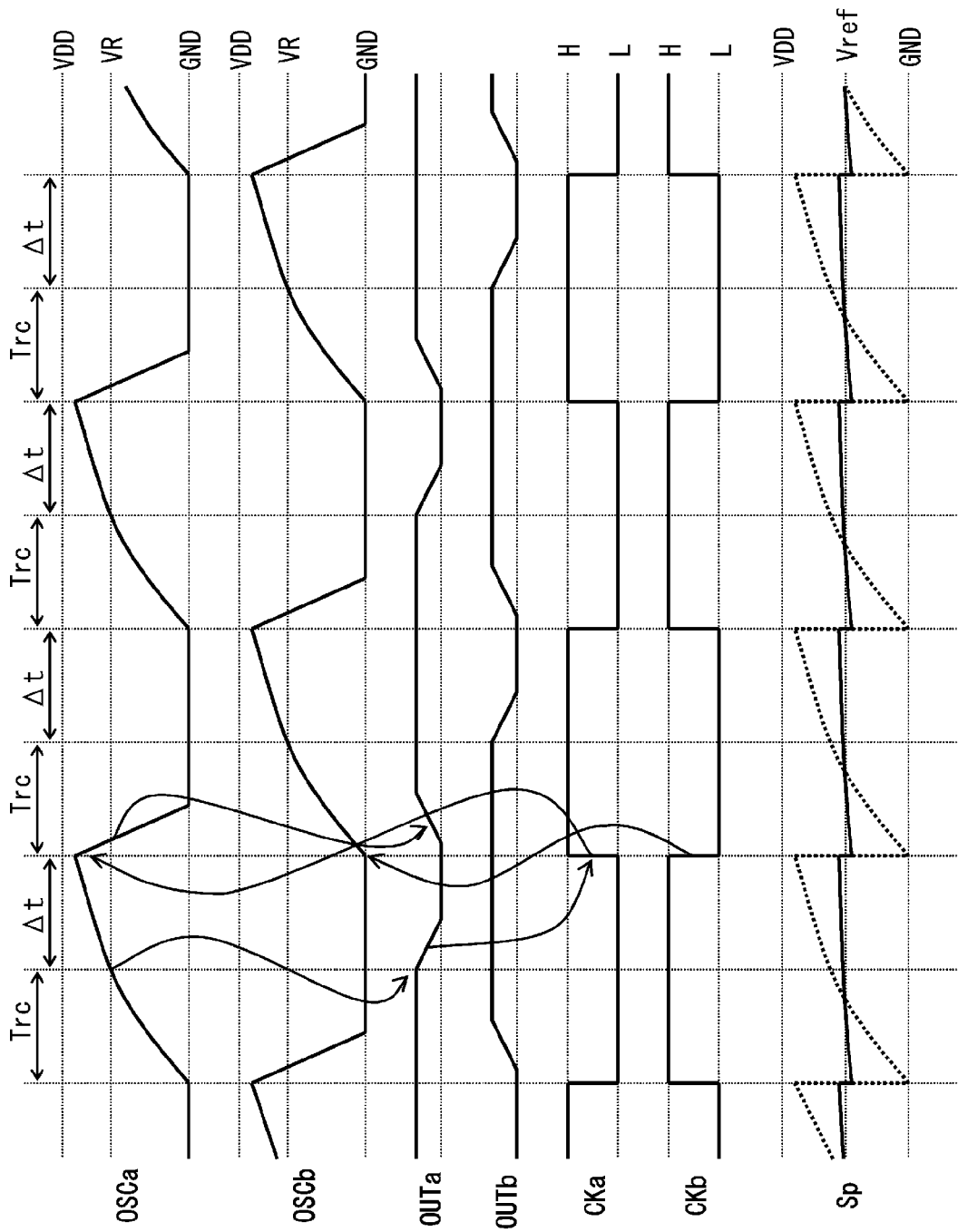
FIG. 11 is a timing chart illustrating operation by a reference frequency generation circuit illustrated in FIG. 10.

As shown in FIG. 10, the reference frequency generation circuit 1 may include, instead of the IC-type oscillator circuit 11 shown in FIG. 1, an RC-type oscillator circuit 21. The oscillator circuit 21 includes resistors R201a and R201b, instead of the constant current sources CS101a and CS101b shown in FIG. 1. As shown in FIG. 11, during transient periods Trc, the oscillation signal OSCa increases with an RC time constant (a time constant determined based on the resistance value of the resistor R201a and the capacitance value of the capacitor Ca), and the oscillation signal OSCb increases with an RC time constant (a time constant determined based on the resistance value of the resistor R201b and the capacitance value of the capacitor Cb). As described above, the constant current sources CS101a and CS101b are replaced with the resistors R201a and R201b, and thus, 1/f noise (noise components which are inversely proportional to a frequency) generated at the constant current sources can be removed. Therefore, the stability of the frequencies of the reference clocks CKa and CKb can be further improved, as compared to the reference frequency generation circuit 1 of FIG. 1. Furthermore, since the resistors R201a and R201b are less susceptible to deterioration over time than the constant current sources CS101a and CS101b, the reference frequency generation circuit 1 of FIG. 10 can accurately generate reference clocks CKa and CKb for a long time.

[Variation 1 of Reference Control Circuit]

Figure 12A:
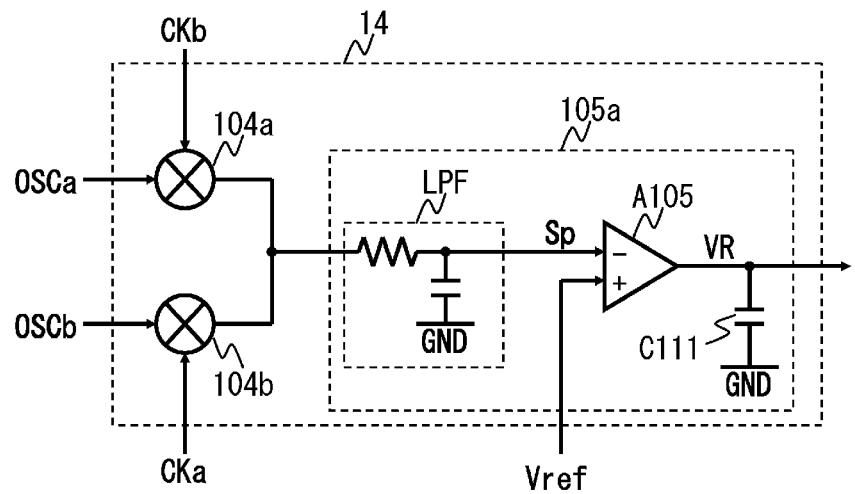
FIGS. 12A and 12B are diagrams illustrating variation 1 of a reference control circuit.
Figure 12B:
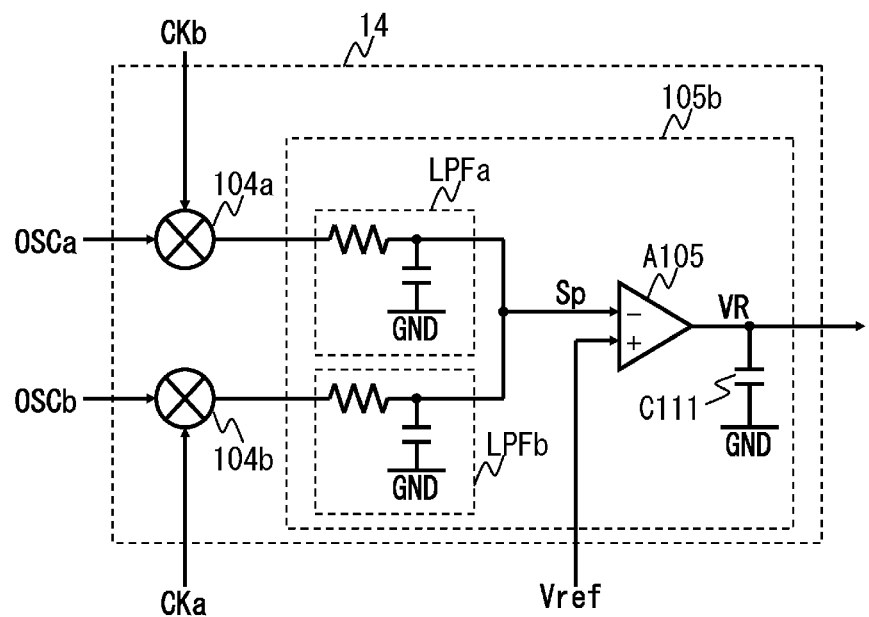

As shown in FIGS. 12A and 12B, the reference control circuit 14 may include an RC filter 105a or an RC filter 105b, instead of the RC filter 105. The RC filter 105a of FIG. 12A includes a low-pass filter LPF having the signal-extracting function, a differential amplifier circuit A105 having the difference-outputting function, and a capacitor C111 configured to smooth the comparison voltage VR from the differential amplifier circuit A105. The RC filter 105b of the FIG. 12B includes, instead of the low-pass filter LPF of FIG. 12A, low-pass filters LPFa and LPFb respectively corresponding to the switches 104a and 104b. In the RC filter 105b, an intermediate signal is extracted from each of the oscillation signals OSCa and OSCb, and then, the extracted intermediate signals are synthesized to be supplied as an intermediate signal Sp to the differential amplifier circuit A105. As described above, the reference control circuit 14 may include the RC filter 105 of FIG. 1, having integrated functions, and may include the RC filter 105a of FIG. 12A or the RC filter 105b of FIG. 12B, each having a separate function. The reference control circuit 14 may further include another circuit (e.g., an attenuator configured to attenuate the power of the oscillation signal which has passed through a switch).

[Variation 2 of Reference Control Circuit]

Figure 13:
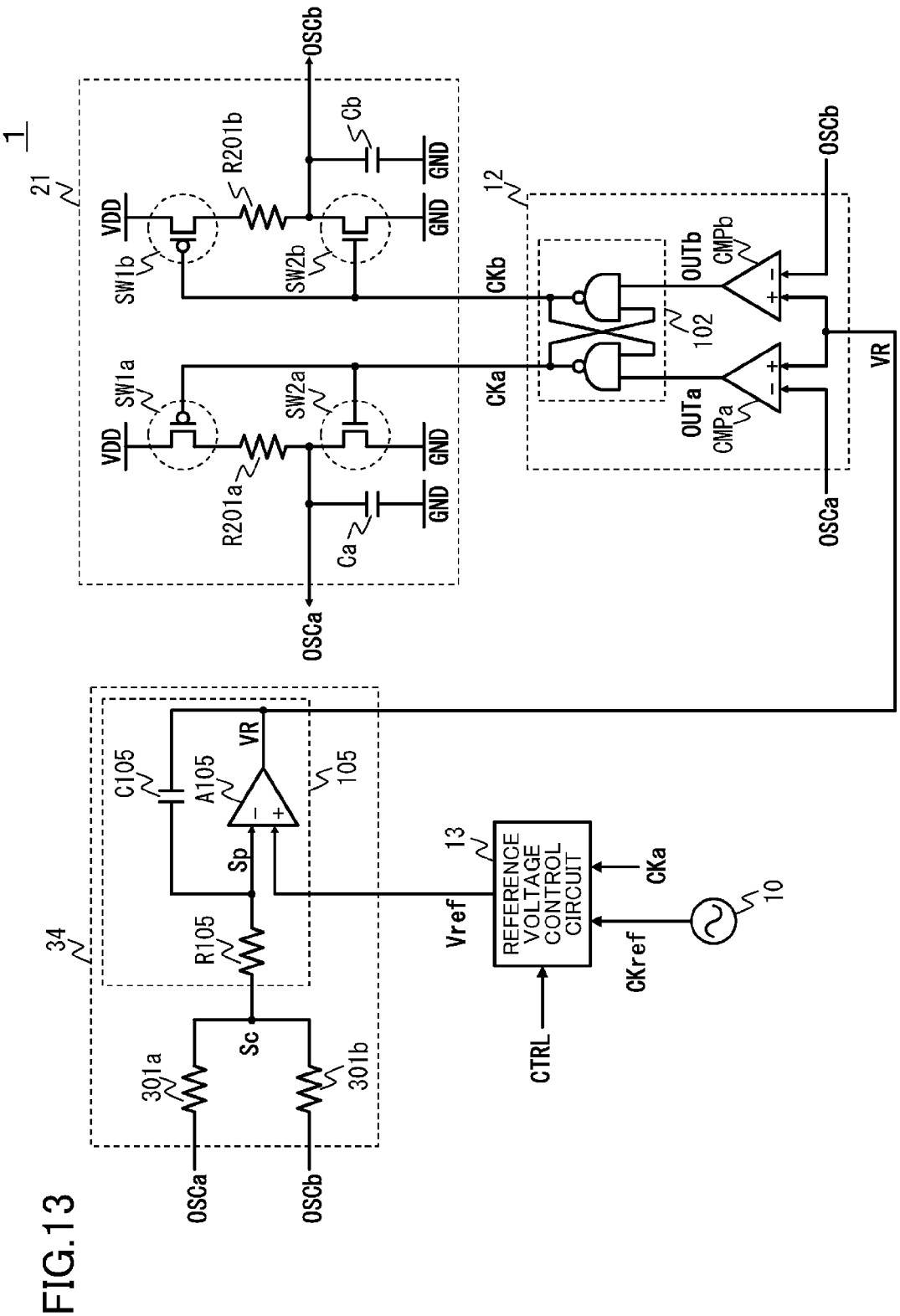
FIG. 13 is a diagram illustrating variation 2 of the reference control circuit.

Further, as shown in FIG. 13, the reference frequency generation circuit 1 may include a reference control circuit 34, instead of the reference control circuit 14 shown in FIG. 1. The reference control circuit 34 includes resistors 301a and 301b, instead of the switches 104a and 104b shown in FIG. 1. Each of the resistors 301a and 301b has one end connected to the RC filter 105. The oscillation signal OSCa is supplied to the other end of the resistor 301a, and the oscillation signal OSCb is supplied to the other end of the resistor 301b.

Figure 14:
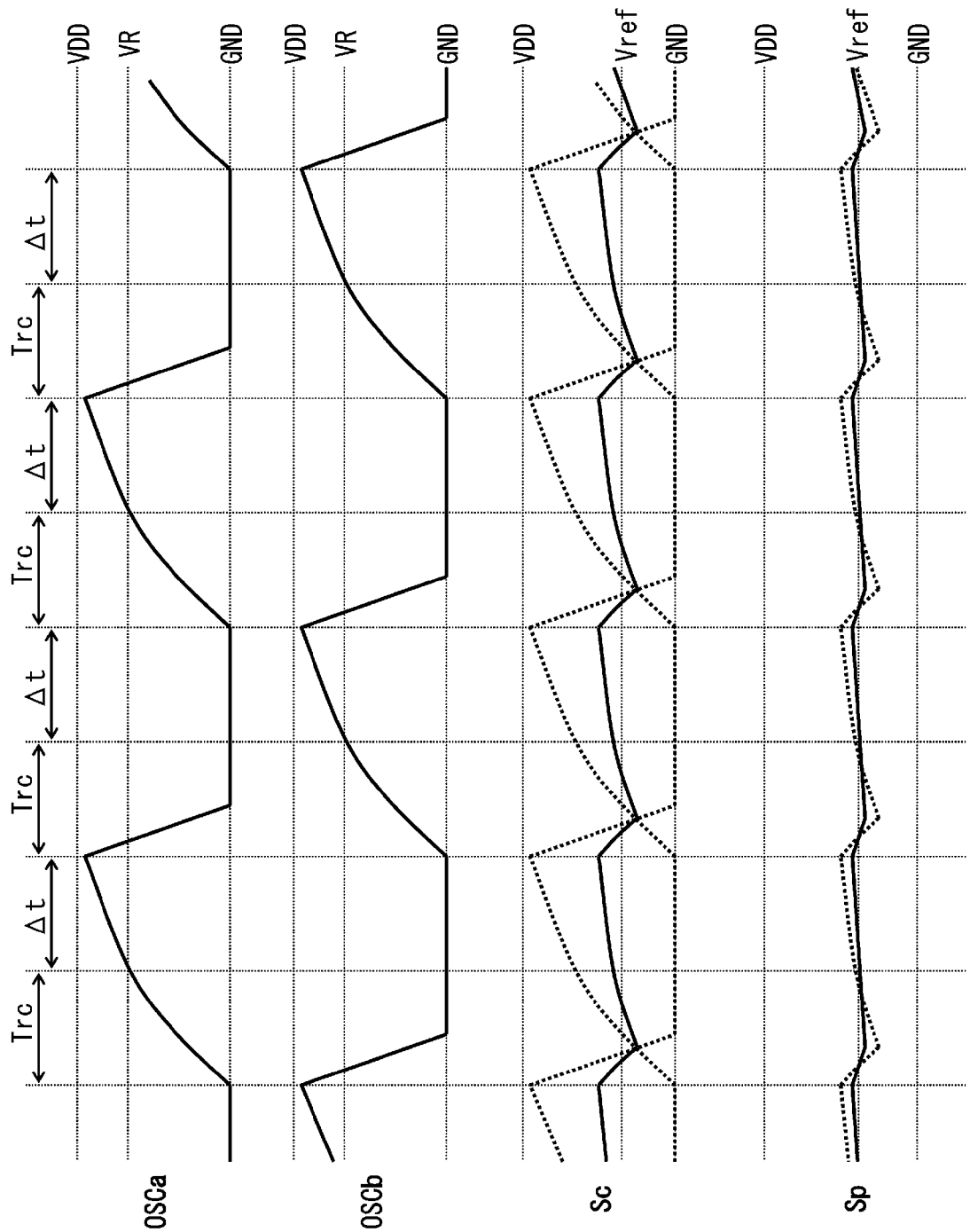
FIG. 14 is a timing chart illustrating operation by a reference frequency generation circuit illustrated in FIG. 13.

As shown in FIG. 14, the oscillation signals OSCa and OSCb which have respectively passed through the resistors 301a and 301b are synthesized to generate a synthesized signal Sc. That is, the oscillation signals OSCa and OSCb are divided by the resistors 301a and 301b, thereby generating the synthesized signal Sc. The RC filter 105 extracts, from the synthesized signal Sc, an intermediate signal Sp which is proportional to the swing of the synthesized signal Sc, and outputs the comparison voltage VR corresponding to a difference between the signal level of the intermediate signal Sp (i.e., the cumulative averaged voltage of the synthesized signal Sc in this case) and the reference voltage Vref.

In the reference control circuit 14 shown in FIG. 10, as the power supply voltage VDD decreases, the swings of the control signals (the reference clocks CKa and CKb) of the switches 104a and 104b decrease. Accordingly, on-resistance distortions of the switches 104a and 104b markedly occur. Thus, in the configuration of the reference frequency generation circuit shown in FIG. 10, it is difficult to achieve reduction in voltage (i.e., reduction in power supply voltage). In contrast, in the reference frequency generation circuit of FIG. 13, which includes the resistors 301a and 301b in place of the switches 104a and 104b, on-resistance distortions do not occur. Therefore, reduction in voltage can be achieved more easily in the reference frequency generation circuit shown in FIG. 13 than in the reference frequency generation circuit shown in FIG. 10.

Note that the reference frequency generation circuit shown in FIG. 13 may include, instead of the RC-type oscillator circuit 21, the IC-type oscillator circuit 11 of FIG. 1.

[Variation 3 of Reference Control Circuit]

Figure 15A:
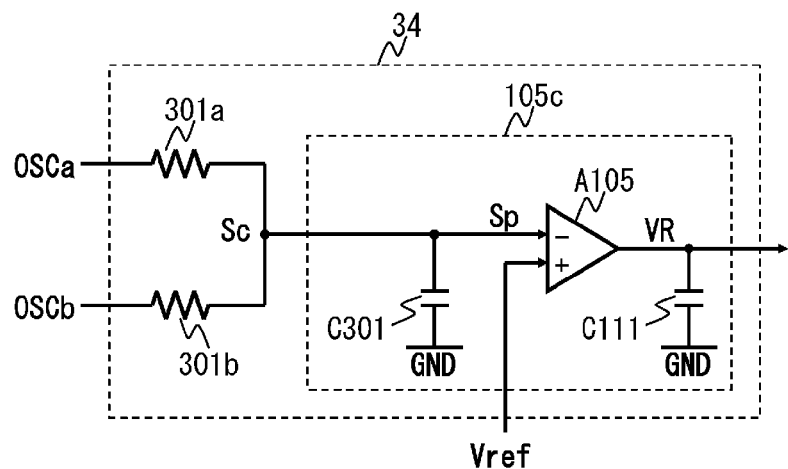
FIGS. 15A and 15B are diagrams illustrating variation 3 of the reference control circuit.
Figure 15B:
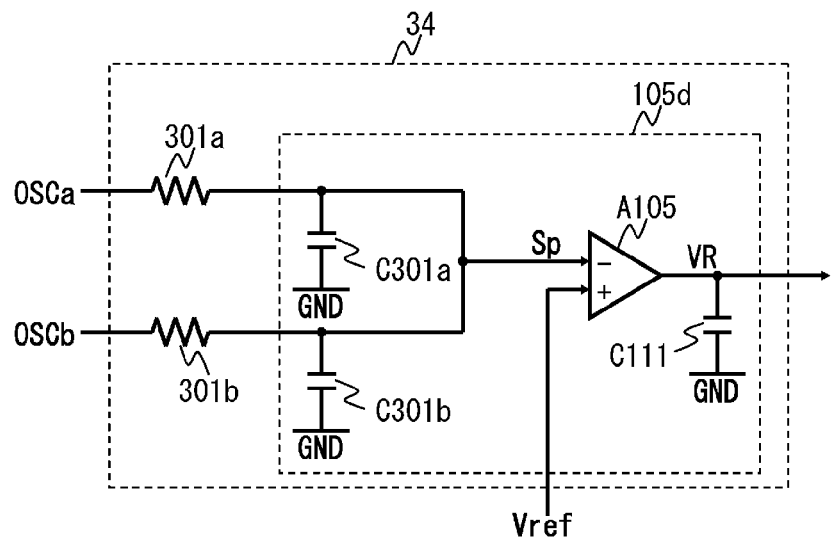

In the reference control circuit 34 of FIG. 13, the RC filter 105 does not have to include the resistor R105. Also, as shown in FIGS. 15A and 15B, the reference control circuit 34 may include, instead of the RC filter 105, an RC filter 105c or an RC filter 105d. The RC filter 105c of FIG. 15A includes a capacitor C301 having the signal-extracting function, the differential amplifier circuit A105, and the capacitor C111. The RC filter 105d of FIG. 15B includes, instead of the capacitor C301 of FIG. 15A, capacitors C301a and C301b respectively corresponding to the resistors 301a and 301b. The reference control circuit 34 may further include another circuit (e.g., an attenuator for attenuating power of each of the oscillation signals OSCa and OSCb which have passed through the resistors 301a and 301b).

[Variations of RC Filter]

Figure 16:
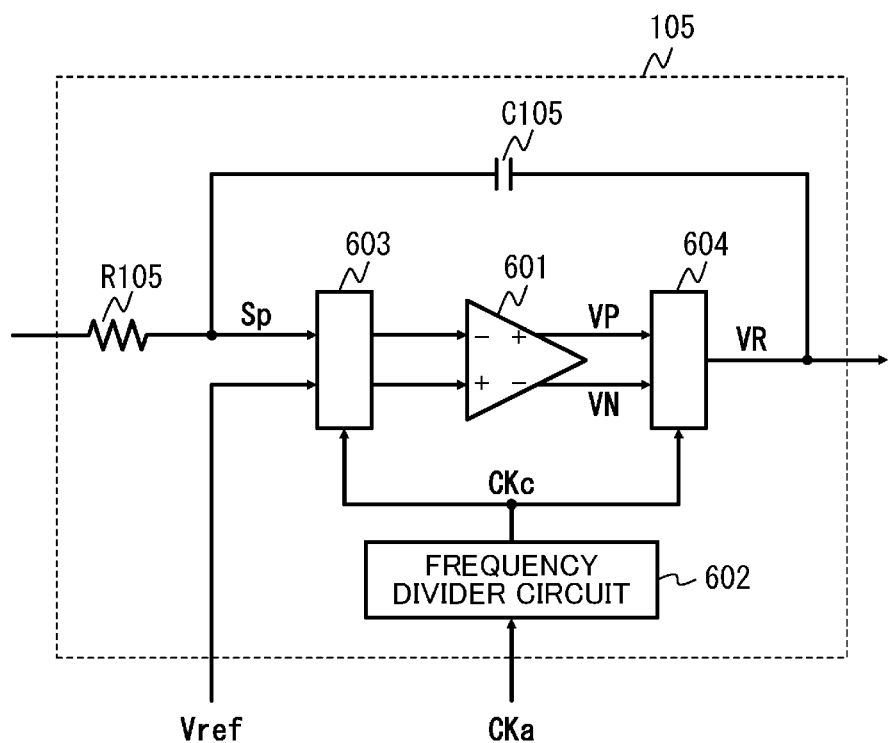
FIG. 16 is a diagram illustrating a variation of an RC filter.

As shown in FIG. 16, the RC filter 105 may include, instead of the differential amplifier circuit A105, a differential amplifier circuit 601 configured to output a pair of output voltages VP and VN corresponding to a difference between the signal level of the intermediate signal Sp and the reference voltage Vref, a frequency divider circuit 602 configured to divide the frequency of the reference clock CKa and output the resultant clock as a control clock CKc, and switches 603 and 604 (chopper circuit) configured to operate in response to the control clock CKc. For example, when the control clock CKc is at the high level, the switch 603 supplies the intermediate signal Sp to the inverting input terminal of the differential amplifier circuit 601, and supplies the reference voltage Vref to a non-inverting input terminal of the differential amplifier circuit 601. The switch 604 selects the output voltage VP output from the non-inverting output terminal of the differential amplifier circuit 601 and outputs the output voltage VP as the comparison voltage VR. When the control clock CKc is at the low level, the switch 603 supplies the intermediate signal Sp to the non-inverting input terminal of the differential amplifier circuit 601, and supplies the reference voltage Vref to the inverting input terminal of the differential amplifier circuit 601. The switch 604 selects the output voltage VN output from an inverting output terminal of the differential amplifier circuit 601 and outputs the output voltage VN as the comparison voltage VR. As described above, the correspondence relationship of the intermediate signal Sp and the reference voltage Vref to the inverting input terminal and the non-inverting input terminal of the differential amplifier circuit 601 is periodically changed, and the output voltages VP and VN are alternately selected as the comparison voltage VR. Accordingly, flicker noise (noise components which are inversely proportional to an element size) in the differential amplifier circuit 601 is spread around harmonics whose frequency is an integral multiple of a chopper frequency (the frequency of the control clock CKc). The flicker noise spread over the harmonics is attenuated by the RC filter 105.

Figure 17A:
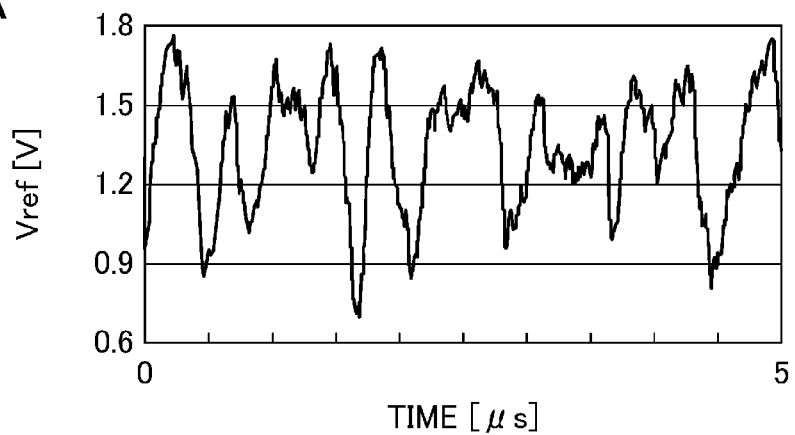
FIG. 17A is a waveform diagram of a comparison voltage when a chopper technique is not used.
Figure 17B:
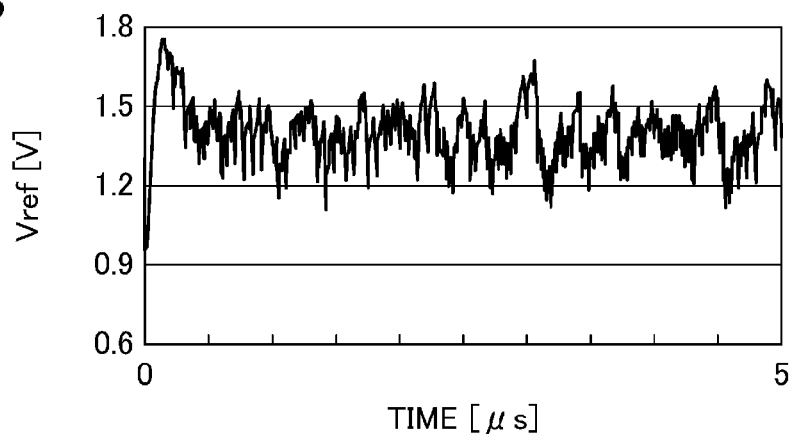
FIG. 17B is a waveform diagram of a comparison voltage when a chopper technique is used.
Figure 18:
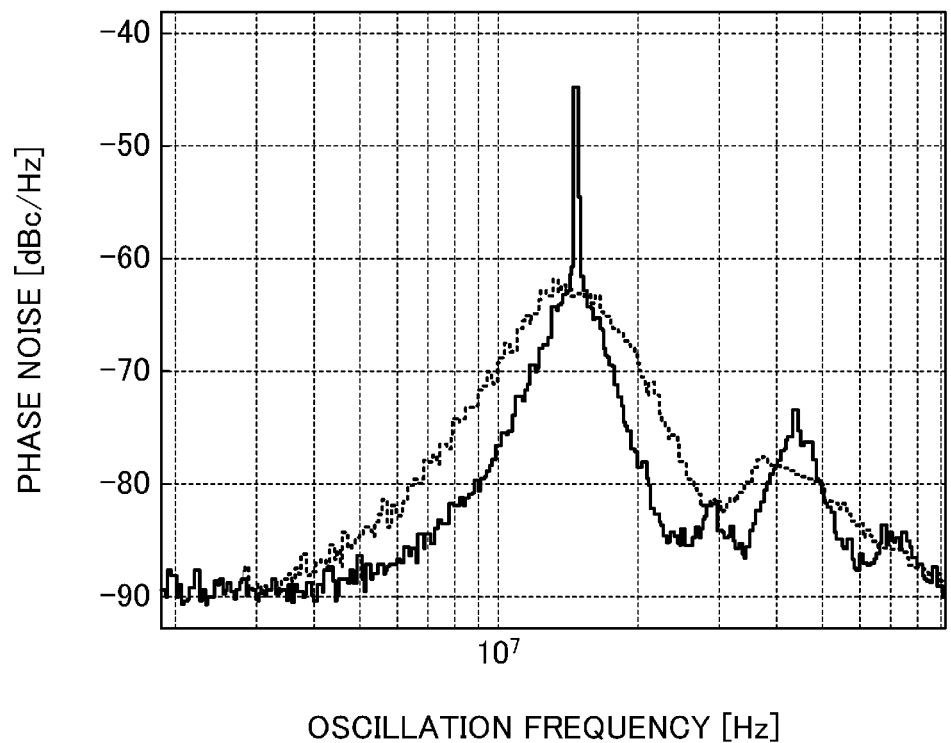
FIG. 18 is a graph showing effects of the chopper technique.

As has been described above, flicker noise superimposed on the comparison voltage VR can be reduced by applying the known chopper technique to the RC filter 105. For example, when the chopper technique is not used, as shown in FIG. 17A, the comparison voltage VR fluctuates slowly with a large amplitude. On the other hand, when the chopper technique is used, as shown in FIG. 17B, the comparison voltage VR fluctuates intensely with a small amplitude. As described above, the fluctuation range of the comparison voltage VR can be reduced, and therefore, as shown in FIG. 18, the resonance characteristic (Q factor) of the reference frequency generation circuit can be further improved. Note that in FIG. 18, the dashed line waveform corresponds to the resonance characteristic when the chopper technique is not used, and the solid line waveform corresponds to the resonance characteristic when the chopper technique is used. Moreover, when the chopper technique is used, the circuit area does not have to be increased to reduce flicker noise. Therefore, the circuit area of the reference frequency generation circuit can be reduced, compared to the circuit area when the chopper technique is not used.

In addition, causing the frequency of the control clock CKc to fall below the frequency of the reference clock CKa can extend a charge/discharge time of a load capacitance (e.g., a parasite capacitance on a signal path) by the differential amplifier circuit 601, as compared to the case where the switches 603 and 604 are controlled using the reference clock CKa. Thus, the drive capability of the differential amplifier circuit 601 can be reduced, so that the power consumption of the differential amplifier circuit 601 can be reduced. Note that, instead of the reference clock CKa, an internal signal (e.g., the reference clock CKb, and the oscillation signals OSCa and OSCb, etc.) of the reference frequency generation circuit, or an external clock may be supplied to the frequency divider circuit 602. The internal signals of the reference frequency generation circuit or an external clock may also be supplied as the control clock CKc to the switches 603 and 604 directly, not via the frequency divider circuit 602.

Note that the chopper technique is applicable not only to the RC filter 105 but also to the RC filters 105a, 105b, 105c, and 105d. That is, each of the RC filters 105a, 105b, 105c, and 105d may include, instead of the differential amplifier circuit A105, the differential amplifier circuit 601, the frequency divider circuit 602, and the switches 603 and 604 of FIG. 16.

[Semiconductor Integrated Circuit and Electronic Device]

Figure 19:
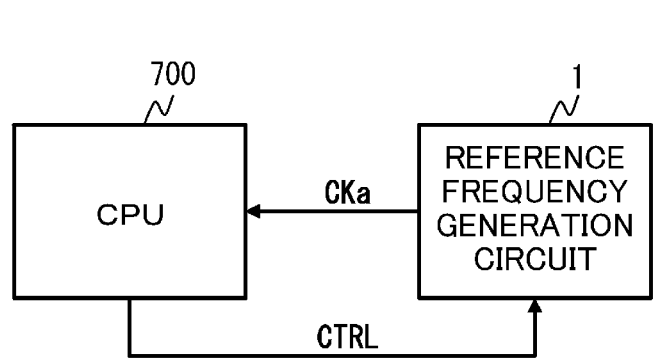
FIG. 19 is a diagram illustrating a configuration example of a semiconductor integrated circuit including a reference frequency generation circuit.

As shown in FIG. 19, the reference frequency generation circuit 1 can be mounted to a semiconductor integrated circuit. A semiconductor integrated circuit 7 of FIG. 19 includes, in addition to the reference frequency generation circuit 1, a CPU 700. The CPU 700 operates using the reference clock CKa from the reference frequency generation circuit 1 as an operation clock.

Figure 20:
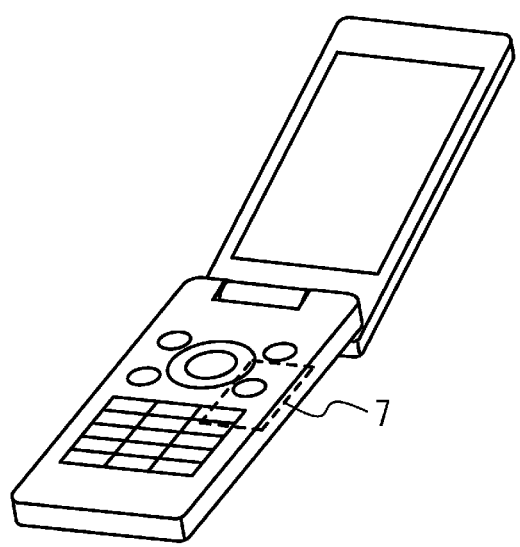
FIG. 20 is a diagram illustrating a configuration example of an electronic device including a semiconductor integrated circuit.

As shown in FIG. 20, the semiconductor integrated circuit 7 can be mounted in an electronic device having, for example, a receiver function, an audio playback function, and an image playback function (specifically, in a mobile device, a digital TV set, a video recording and playback device, a video game device, a portable video game device, etc.). The semiconductor integrated circuit and the electronic device including the reference frequency generation circuit 1 mounted thereto can operate accurately.

A majority of electronic devices having a clock function includes a quartz oscillator (for example, a relatively inexpensive 32-kHz quartz oscillator). Such a quartz oscillator can generate a clock with high accuracy (for example, a clock with a frequency accuracy of about 10 ppm). The reference clocks CKa and CKb can be accurately corrected by using the clock generated by the above quartz oscillator as the basis clock CKref.

It is often required that electronic devices with an audio playback function have good phase noise characteristics in the voice band. Accordingly, such an electronic device often includes a relatively expensive quartz oscillator operating at a frequency in a range from several MHz to several ten MHz in order to generate a reference clock ranging from several MHz to several ten MHz. On the other hand, in an electronic device including the reference frequency generation circuit 1 (in particular, the reference frequency generation circuit 1 with the RC filter shown in FIG. 16), which can accurately generate a reference clock ranging from several MHz to several ten MHz by means of a relatively inexpensive 32-kHz quartz oscillator, costs for parts of the electronic device can be reduced. It is also possible to reduce costs for mounting the quartz oscillator and costs for testing the quartz oscillator.

[Polarity of Reference Frequency Generation Circuit]

Figure 21:
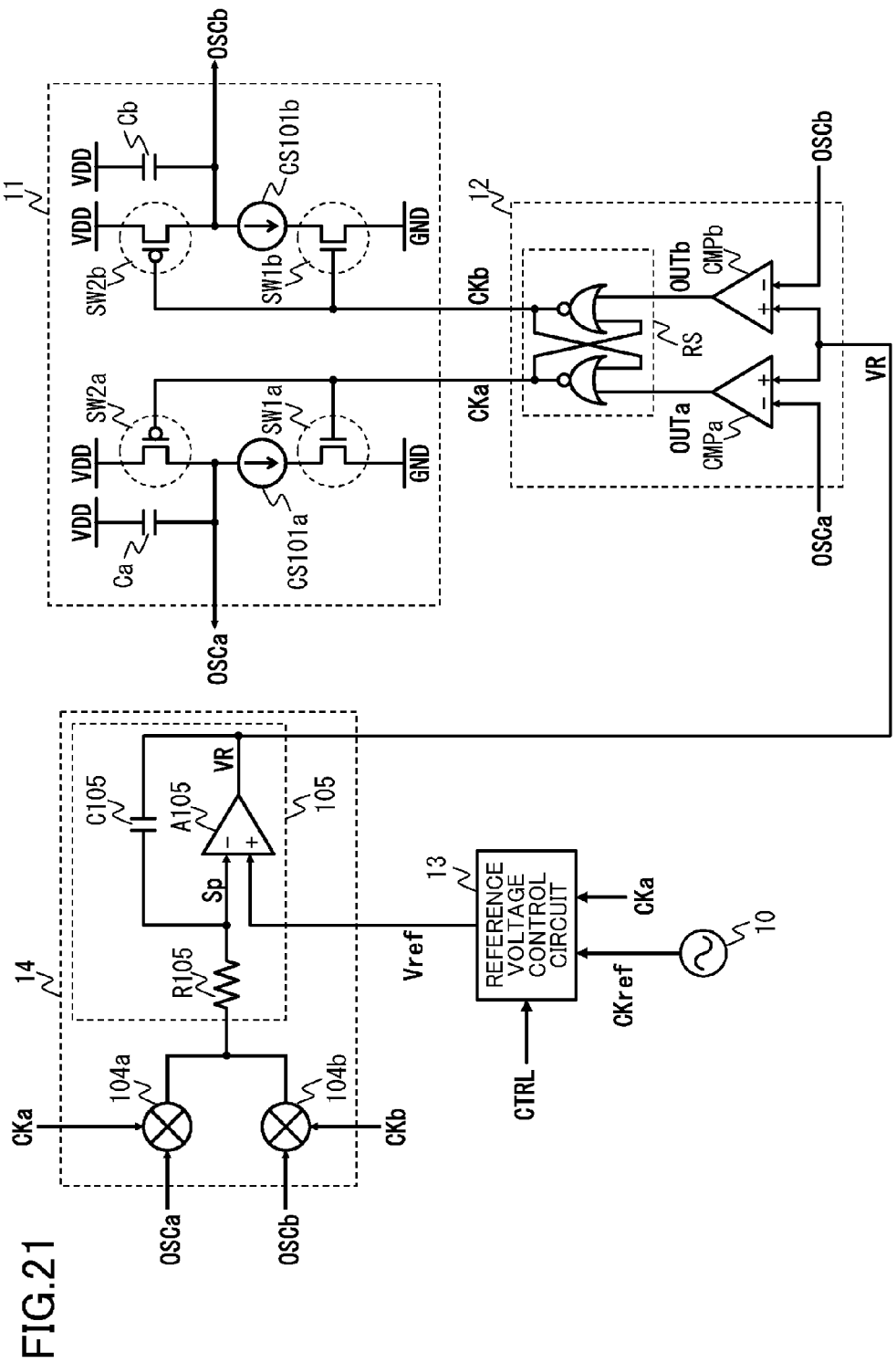
FIG. 21 is a diagram illustrating a variation of the reference frequency generation circuit.

In the above-described embodiment, the polarity of the reference frequency generation circuit 1 may be reversed. That is, the reference frequency generation circuit 1 may serve to reduce the signal level of an oscillation signal with a predetermined time constant. For example, the reference frequency generation circuit 1 of FIG. 1 may be formed to have the configuration of FIG. 21. In the reference frequency generation circuit of FIG. 21, the oscillator circuit 11 alternately performs, in response to transitions of the signal levels of the reference clocks CKa and CKb, an operation to increase the signal level of the oscillation signal OSCa and reduce the signal level of the oscillation signal OSCb with an IC time constant, and an operation to reduce the signal level of the oscillation signal OSCa with the IC time constant and increase the signal level of the oscillation signal OSCb. When detecting that the signal level of the oscillation signal OSCa (or the signal level of the oscillation signal OSCb) has fallen below the comparison voltage VR, the oscillation control circuit 12 causes the signal levels of the reference clocks CKa and CKb to transition. The above-described configuration also enables not only reduction of frequency fluctuations of a reference clock caused by fluctuations in delay time, but also correction of the frequency fluctuations.

As described above, the reference frequency generation circuit can correct frequency fluctuations of a reference clock, and therefore, is useful for use in a timer of a semiconductor integrated circuit, generating an operation clock, and generating a sampling clock, etc.

Note that the foregoing embodiment has been set forth merely for the purpose of a preferred example in nature, and is not intended to limit the scope, applications, and use of the invention.

What is claimed is:

1. A reference frequency generation circuit which generates a reference clock, the circuit comprising:
    an oscillator circuit configured to alternately perform, in response to a transition of a signal level of the reference clock, an operation to increase a signal level of a first oscillation signal and reduce a signal level of a second oscillation signal, and an operation to increase the signal level of the second oscillation signal and reduce the signal level of the first oscillation signal;
    an oscillation control circuit configured to cause, when detecting that the signal level of the first oscillation signal has reached a comparison voltage, the signal level of the reference clock to transition to a first logic level, and cause, when detecting that the signal level of the second oscillation signal has reached the comparison voltage, the signal level of the reference clock to transition to a second logic level;
    a reference control circuit configured to increase or reduce the comparison voltage such that a difference between a signal level of an intermediate signal which is proportional to respective swings of the first and second oscillation signals and a reference voltage is reduced; and
    a reference voltage control circuit configured to increase or reduce the reference voltage according to a frequency difference between a basis clock having a predetermined basis frequency and the reference clock.

2. The circuit of claim 1, wherein
the reference voltage control circuit is switchable between a frequency correction mode and a constant frequency mode,
in the frequency correction mode, the reference voltage control circuit increases or reduces the reference voltage according to the frequency difference between the basis clock and the reference clock, and
in the constant frequency mode, the reference voltage control circuit maintains the reference voltage regardless of the frequency difference between the basis clock and the reference clock.

3. The circuit of claim 2, wherein
the reference voltage control circuit includes:
    a frequency comparator configured to count the number of transitions of the basis clock and the number of transitions of the reference clock in a predetermined period and output, as a frequency difference value, a difference in the number of transitions between the basis clock and the reference clock in the frequency correction mode, and to maintain the frequency difference value in the constant frequency mode;

a digital controller configured to increase or reduce, according to the frequency difference value, a control value corresponding to a voltage level of the reference voltage; and a digital-to-analog converter configured to convert the control value into the reference voltage.

4. The circuit of claim 1, wherein
the reference voltage control circuit includes:
a phase frequency comparator configured to detect a phase difference and a frequency difference between the basis clock and the reference clock, and to output a phase difference value and a frequency difference value respectively corresponding to the phase difference and the frequency difference;

a digital controller configured to increase or reduce, according to the phase difference value and the frequency difference value, a control value corresponding to a voltage level of the reference voltage;

a ΔΣ modulator configured to perform ΔΣ modulation on the control value obtained by the digital controller;

a digital-to-analog converter configured to convert the control value processes by the ΔΣ modulator into the reference voltage; and a low-pass filter configured to attenuate high-frequency components of the reference voltage obtained by the digital-to-analog converter.

5. The circuit of claim 3, wherein
the digital-to-analog converter includes:
a resistance divider configured to generate a plurality of different analog voltages by resistance division between a first voltage and a second voltage which are different from each other; and a selector configured to select, as the reference voltage, one of the analog voltages generated by the resistance divider according to the control value provided to the digital-to-analog converter.

6. The circuit of claim 1, wherein
the reference voltage control circuit includes:
a frequency divider configured to divide a frequency of the reference clock to output a divided clock;

a phase frequency comparator configured to detect a phase difference and a frequency difference between the basis clock and the divided clock, and to output a charge signal or a discharge signal according to the phase difference and the frequency difference;

a charge pump configured to output, as an output current, one of a charge current for increasing the reference voltage or a discharge current for reducing the reference voltage, in response to the charge signal or the discharge signal; and a low-pass filter configured to convert the output current from the charge pump into the reference voltage.

7. The circuit of claim 1, wherein
the reference voltage control circuit includes:
a frequency divider configured to divide a frequency of the reference clock to output a divided clock;

a phase frequency comparator configured to detect a phase difference and a frequency difference between the basis clock and the divided clock, and to output an output current according to the phase difference and the frequency difference; and a low-pass filter configured to convert the output current from the phase frequency comparator into the reference voltage.

8. The circuit of claim 1, wherein
the basis clock is supplied to the reference voltage control circuit through a radio path.

9. The circuit of claim 2, wherein
a period during which the reference voltage control circuit is in the frequency correction mode is set in an inspection period during which the reference frequency generation circuit or a semiconductor integrated circuit including the reference frequency generation circuit is subjected to an inspection before shipment from a factory.

10. The circuit of claim 2, wherein
a period during which the reference voltage control circuit is in the frequency correction mode is set in a period during which an electronic device including the reference frequency generation circuit is not in operation.

11. The circuit of claim 2, wherein
a period during which the reference voltage control circuit is in the frequency correction mode is set after selection of a channel by a receiver including the reference frequency generation circuit.

12. The circuit of claim 2, wherein
a period during which the reference voltage control circuit is in the frequency correction mode is set after selection of a musical piece or immediately before playing back of the musical piece by an audio playback device including the reference frequency generation circuit.

13. The circuit of claim 2, wherein
a period during which the reference voltage control circuit is in the frequency correction mode is set after selection of a moving image or immediately before playing back of the moving image by an image playback device including the reference frequency generation circuit.

14. A semiconductor integrated circuit, comprising:
the reference frequency generation circuit of claim 1; and
a CPU configured to operate in synchronization with the reference clock from the reference frequency generation circuit.

15. An electronic device, comprising:
the semiconductor integrated circuit of claim 14.

16. The circuit of claim 4, wherein
the digital-to-analog converter includes:
a resistance divider configured to generate a plurality of different analog voltages by resistance division between a first voltage and a second voltage which are different from each other; and a selector configured to select, as the reference voltage, one of the analog voltages generated by the resistance divider according to the control value provided to the digital-to-analog converter.

* * * * *